(12) United States Patent
Enicks

(10) Patent No.: US 7,495,250 B2
(45) Date of Patent: Feb. 24, 2009

(54) INTEGRATED CIRCUIT STRUCTURES HAVING A BORON- AND CARBON-DOPED ETCH-STOP AND METHODS, DEVICES AND SYSTEMS RELATED THERETO

(75) Inventor: Darwin G. Enicks, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 99 days.

(21) Appl. No.: 11/553,333

(22) Filed: Oct. 26, 2006

(65) Prior Publication Data

US 2008/0099882 A1    May 1, 2008

(51) Int. Cl.
*H01L 29/06* (2006.01)
(52) U.S. Cl. .................. 257/19; 257/279; 257/616; 257/E21.182; 257/E31.046; 438/752; 438/933
(58) Field of Classification Search .................. None
See application file for complete search history.

(56) References Cited

U.S. PATENT DOCUMENTS

| | | | |
|---|---|---|---|
| 4,652,183 A | 3/1987 | Veltri et al. |
| 5,155,571 A | 10/1992 | Wang et al. |
| 5,378,901 A | 1/1995 | Nii |
| 5,466,949 A | 11/1995 | Okuno |
| 5,569,538 A | 10/1996 | Cho |
| 5,906,708 A | 5/1999 | Robinson et al. |
| 5,965,931 A | 10/1999 | Wang et al. |
| 6,064,081 A | 5/2000 | Robinson et al. |
| 6,165,891 A | 12/2000 | Chooi et al. |
| 6,323,108 B1 * | 11/2001 | Kub et al. .................. 438/458 |
| 6,399,970 B2 | 6/2002 | Kubo et al. |
| 6,531,369 B1 | 3/2003 | Ozkan et al. |
| 6,552,375 B2 | 4/2003 | Swanson et al. |

(Continued)

FOREIGN PATENT DOCUMENTS

WO    WO-2007/001672 A2    1/2007

(Continued)

OTHER PUBLICATIONS

Prof. Ulrich Gösele et al., Science and Technology of Semiconductor Wafer Bonding, Duke Univ., Chap. 7, Wafer Bonding Laboratory, Thinning Procedures [online]. Undated [retrieved Aug. 26, 2006]. Retrieved from the Internet: < URL: www.duke.edu/web/wbl/ch7 >.

(Continued)

*Primary Examiner*—Evan Pert
*Assistant Examiner*—Scott R Wilson
(74) *Attorney, Agent, or Firm*—Schwegman, Lundberg & Woessner, P.A.

(57) ABSTRACT

A method for forming an etch-stop layer and a resulting structure fabricated therefrom. The etch-stop layer is a silicon-germanium layer having a ratio of silicon to germanium of about 50:1 or less, a boron layer formed within the silicon-germanium layer where the boron layer has a full-width half-maximum (FWHM) thickness value of less than 50 nanometers, and a carbon layer formed within the silicon-germanium layer where the carbon layer has an FWHM thickness value of less than 50 nanometers. A ratio of boron to carbon in the etch-stop layer is in a range of about 0.5 to 1.5.

24 Claims, 6 Drawing Sheets

U.S. PATENT DOCUMENTS

| | | |
|---|---|---|
| 6,656,809 B2 | 12/2003 | Greenberg et al. |
| 6,670,542 B2 | 12/2003 | Sakata et al. |
| 6,680,494 B2 | 1/2004 | Gutierrez-Aitken et al. |
| 6,744,079 B2 | 6/2004 | Jagannathan et al. |
| 6,750,484 B2 | 6/2004 | Lippert et al. |
| 6,759,694 B1 | 7/2004 | Hsu et al. |
| 6,855,963 B1 | 2/2005 | Chu et al. |
| 6,906,400 B2 | 6/2005 | Delhougne et al. |
| 6,936,910 B2 | 8/2005 | Ellis-Monaghan et al. |
| 6,963,089 B2 | 11/2005 | Shi et al. |
| 6,995,430 B2 | 2/2006 | Langdo et al. |
| 7,074,623 B2 | 7/2006 | Lochtefeld et al. |
| 7,091,114 B2 | 8/2006 | Ito et al. |
| 2002/0081861 A1 | 6/2002 | Robinson et al. |
| 2002/0105015 A1 | 8/2002 | Kubo et al. |
| 2003/0040130 A1 | 2/2003 | Mayur et al. |
| 2003/0080394 A1 | 5/2003 | Babcock et al. |
| 2003/0082882 A1 | 5/2003 | Babcock et al. |
| 2003/0132453 A1 | 7/2003 | Greenberg et al. |
| 2004/0009649 A1 | 1/2004 | Kub et al. |
| 2004/0031979 A1 | 2/2004 | Lochtefeld et al. |
| 2004/0063293 A1 | 4/2004 | Greenberg et al. |
| 2004/0164336 A1 | 8/2004 | Weimer et al. |
| 2004/0222486 A1 | 11/2004 | Ellis-Monaghan et al. |
| 2005/0045905 A1 | 3/2005 | Chu et al. |
| 2005/0051861 A1 | 3/2005 | Shi et al. |
| 2005/0112857 A1 | 5/2005 | Gluschenkov et al. |
| 2005/0127392 A1 | 6/2005 | Chu et al. |
| 2005/0181555 A1 | 8/2005 | Haukka et al. |
| 2005/0191911 A1 | 9/2005 | Greenberg et al. |
| 2005/0230705 A1 | 10/2005 | Taylor |
| 2005/0280103 A1 | 12/2005 | Langdo et al. |
| 2006/0030093 A1 | 2/2006 | Zhang et al. |
| 2006/0068557 A1 | 3/2006 | Ochimizu et al. |
| 2006/0186510 A1 | 8/2006 | Lochtefelf et al. |
| 2006/0273392 A1 | 12/2006 | Ito et al. |
| 2006/0284165 A1 | 12/2006 | Berger et al. |
| 2006/0292809 A1 | 12/2006 | Enicks et al. |
| 2007/0054460 A1 | 3/2007 | Enicks |
| 2007/0290193 A1 | 12/2007 | Tucker |
| 2008/0050883 A1 | 2/2008 | Enicks |
| 2008/0099840 A1 | 5/2008 | Enicks |
| 2008/0237716 A1 | 10/2008 | Enicks et al. |

FOREIGN PATENT DOCUMENTS

| | | |
|---|---|---|
| WO | WO-2008/024587 A2 | 2/2008 |
| WO | WO-2008/054957 A1 | 5/2008 |
| WO | WO-2008/057692 A2 | 5/2008 |
| WO | WO-2008/057692 A3 | 5/2008 |
| WO | WO-2008/057695 A1 | 5/2008 |

OTHER PUBLICATIONS

D. Enicks et al., "Thermal Redistribution of Oxygen and Carbon in Sub-50 NM Strained Layers of Boron Doped SiGeC", ECS Transactions, 3 (7), 2006, pp. 1087-1098.

U.S. Appl. No. 11/166,287, Non-Final Office Action mailed Apr. 3, 2008, 11 pgs.

U.S. Appl. No. 11/467,480, Non-Final Office Action mailed Feb. 21, 2008, 3 pgs.

U.S. Appl. No. 11/553,313, Notice of Allowance mailed Jun. 2, 2008, 6 pgs.

International Application No. PCT/US07/80830 International Search Report mailed Mar. 6, 2008, 2 pgs.

International Application No. PCT/US07/80830 Written Opinion mailed Mar. 6, 2008, 4 pgs.

Enicks, D., "Enhanced Carbon Confinement of Ultra Narrow Boron Profiles in SiGeC HBTs", *IEEE Transactions on Electronic Devices*, 53(8), (2006), 6 pgs.

Enicks, D., "Pseudormorphic Growth of Sub-40 nm $Si_{1-x-y}Ge_xC_y$ by LPCVD with Enhanced Boron Confinement and Carrier Transport for Advanced NPN HBTs", *White Paper from Atmel Corporation*, (Aug. 2003), 11 pgs.

Kar, G. S., et al., "Effect of Carbon on Lattice Strain and Hole Mobility in $Si_{1-x}Ge_x$ Alloys", *Journal of Materials Science: Materials in Electronics* 131(1), (2002), 44-55.

U.S. Appl. No. 11/166,287, Response filed Jan. 23, 2008 to Restriction Requirement mailed Jan. 16, 2008, 1 pg.

U.S. Appl. No. 11/166,287, Restriction Requirement mailed Jan. 16, 2008, 5 pgs.

U.S. Appl. No. 11/467,480 Response filed May 21, 2008 to Non-Final Office Action mailed Feb. 21, 2008, 18 pgs.

U.S. Appl. No. 11/553,313, Amendment and Response filed Apr. 2, 2008 to Non-Final Office Action mailed Jan. 2, 2008, 8 pgs.

U.S. Appl. No. 11/553,313, Non-Final Office Action mailed Jan. 2, 2008, 12 pgs.

U.S. Appl. No. 11/554,430, Response and Preliminary Amendment filed Apr. 11, 2008 to Restriction Requirement mailed Mar. 13, 2008, 9 pgs.

U.S. Appl. No. 11/554,430, Restriction Requirement mailed Mar. 13, 2008, 6 pgs.

International Application No. PCT/US07/80723, International Search Report mailed Mar. 6, 2008, 2 pgs.

International Application No. PCT/US07/80723, Written Opinion mailed Mar. 6, 2008, 5 pgs.

"U.S. Appl. No. 11/553,313 Notice of Allowance mailed Sep. 25, 2008", 6 pp.

"U.S. Appl. No. 11/554,430 Non-Final Office Action mailed Sep. 30, 2008", 11 pp.

"U.S. Appl. No. 12/144,571 Non-Final Office Action mailed Nov. 5, 2008", 13 pp.

\* cited by examiner

Fig._5

INTEGRATED CIRCUIT STRUCTURES HAVING A BORON- AND CARBON-DOPED ETCH-STOP AND METHODS, DEVICES AND SYSTEMS RELATED THERETO

TECHNICAL FIELD

The invention relates generally to methods of fabrication of integrated circuits (ICs). More particularly the invention is a method of fabricating a highly selective carbon etch-stop in ICs in which the etch-stop has little diffusion into surrounding semiconductor layers even when subjected, to elevated temperatures.

BACKGROUND ART

Several material systems have emerged as key facilitators to extend Moore's law well into the next decade. These key facilitators include (1) silicon-on-insulator (SOI), (2) silicon-germanium, (SiGe), and (3) strained silicon. With reference to SOI and related technologies, there are numerous advantages associated with an insulating substrate. These, advantages include reduced parasitic capacitances, improved electrical isolation, and reduced short-channel-effects. Advantages of SOI can be combined with energy bandgap and carrier mobility improvements offered by $Si_{1-x}Ge_x$ and strained silicon devices.

SOI substrates generally include a thin layer of silicon on top of an insulator. Integrated circuit components are formed in and on the thin layer of silicon. The insulator can be comprised of insulators such as silicon dioxide ($SiO_2$), sapphire, or various other insulative materials.

Currently, several techniques are available to fabricate SOI substrates. One technique for fabricating SOI substrates is separation by implantation of oxygen (SIMOX). In a SIMOX process, oxygen is implanted below a surface of a silicon wafer. A subsequent anneal step produces a buried silicon dioxide layer with a silicon overlayer. However, the time required for an implantation in a SIMOX process can be extensive and, consequently, cost prohibitive. Moreover, an SOI substrate formed by SIMOX may be exposed to high surface damage arid contamination.

Another technique is bond-and-etch-back SOI (BESOI), where an oxidized wafer is first diffusion-bonded to a non-oxidized wafer. With reference to FIG. 1A, a silicon device wafer 100 and a silicon handle wafer 150 comprise major components for forming a BESOI wafer. The silicon device wafer 100 includes a first silicon layer 101, which will serve as a device layer, an etch-stop layer 103, and a second silicon layer 105. The etch-stop layer 103 is frequently comprised of carbon. The silicon handle wafer 150 includes a lower silicon dioxide layer 107A, a silicon substrate layer 109, and an upper silicon dioxide layer 107B. The lower 107A and upper 107B silicon dioxide layers are frequently thermally grown oxides foxed concurrently.

In FIG. 1B, the silicon device wafer 100 and the silicon handle water 150 are brought into physical contact and bonded, one to the other. The initial bonding process is followed by a thermal anneal, thus strengthening the bond. The silicon device wafer 100 in the bonded pair is thinned. Initially, most of the second silicon layer 105 is removed by mechanical grinding and polishing until only a few tens of micrometers (i e., "microns" or μm) remains. A high-selectivity wet or dry chemical etch removes remaining portions of the second silicon layer 105, stopping on the etch-stop layer 103. (Selectivity is discussed in detail, below.) An end-result of the second silicon layer 105 etch process is depicted in FIG. 1C.

During the etching process the silicon handle wafer 150 is protected by a coated mask layer (not shown). In FIG. 1D, the etch-stop layer 103 has been removed using another high-selectivity enchant. As a result of these processes, the first silicon layer 101, serving as a device layer, is transferred to the silicon handle water 150. A backside of the silicon substrate layer 109 is ground, polished, and etched to achieve a desired overall thickness.

To ensure BESOI substrates are thin enough for subsequent fabrication steps as well as to meet contemporary demands for ever-decreasing physical size and weight constraints, BESOI requires the etch-stop layer 103 during the layer transfer process. Currently, two main layer transfer technologies exist: 1) selective chemical etching, and 2) splitting of a hydrogen-implanted layer from a device layer (a hydrogen implantation and separation process). Both technologies have demonstrated the ability to meet requirements of advanced semiconductor processing.

In the hydrogen implantation and separation process, hydrogen ($H_2$) is implanted into icon having a thermally grown silicon dioxide layer. The implanted $H_2$ produces embrittlement of the silicon substrate underlying the silicon dioxide layer. The $H_2$ implanted wafer may be bonded with a second silicon wafer having a silicon dioxide overlayer. The bonded wafer may be cut across the wafer at a peak location of the hydrogen implant by appropriate annealing.

The BESOI process described is relatively free from ion implant damage inherent in the SIMOX process. However, the BESOI process requires a time consuming sequence of grinding, polishing, and chemical etching.

Contemporary Etch-stops

As described above, the BESOI process is a manufacturing-oriented technique to build silicon on insulator substrates and is partially dependent upon chemical etching.

Etch-stop performance is described by a mean etch selectivity, S, which defines an etch rate ratio of silicon to the etch-stop layer $$S = \frac{R_{Si}}{R_{es}}$$

where $R_{Si}$ is an etch rate of silicon and $R_{es}$ is an etch rate of the etch-stop. Therefore, a selectivity value where S=1 relates to a case of no etch selectivity.

One method to evaluate etch-stop efficiency is to measure a maximum etch step height across an etch-stop and non-etch-stop boundary. In FIG. 2A, an etch-stop 203A is formed by ion implantation into a portion of a silicon substrate 201A. The etch-stop 203A has a thickness $d_1$ at time t=0 (i.e., prior to application of any etchant). At time $t=t_1$ (FIG. 2B) a partially etched silicon substrate 201B is etched to a depth $h_1$. The etch-stop 203A is flow a partially etched etch-stop 203B. The partially etched etch-stop 203B is etched to a thickness of $d_2$. At time $t=t_2$ (FIG. 2C), the partially etched etch-stop 203B has been completely etched and a fully etched silicon substrate 201C achieves a maximum etch step height of $h_2$. An etch rate of the etch-stop 203A (FIG. 2A) is partially dependent upon both a dopant material implanted as well as an implant profile of the dopant employed. From a practical point of view, the maximum etch step is a critical quantity since it determines an acceptable thickness variation of the device wafer after grinding and polishing prior to etch back in the BESOI process.

For example, if a maximum etch step is 3 units, the allowable thickness non-uniformity of the device wafer after the usual mechanical thinning procedure should be, less than 1.5 units. The mean etch selectivity, S, can be derived from the effective etch-stop layer thickness $d_1$ and the maximum etch step $h_2$ as $$S = \frac{\frac{d_1 + h_2}{t}}{\frac{d_1}{t}}$$

$$\Downarrow$$

$$S = 1 + \frac{h_2}{d_1}$$

where t is the etch time required to reach the maximum etch step height $h_2$. In the prior example, $t_2$ is the etch time required to reach the maximum etch step height $h_2$.

Aqueous alkaline solutions are commonly used anisotropic silicon etchants. Two categories of aqueous alkaline solutions employed are: (1) pure inorganic aqueous alkaline solutions such as potassium hydroxide (KOH), sodium hydroxide (NaOH), cesium hydroxide (CsOH), and ammonium hydroxide ($NH_4OH$); and (2) organic alkaline aqueous solutions such as ethylenediamine-pyrocatechol-water (aqueous EDP), tetramethyl ammonium hydroxide (TMAH or $(CH_3)_4NOH$) and hydrazine ($H_4N_2$).

FIG. 3 graphically indicates etch selectivity differences between non-aqueous EDP and a 45% KOH etchant for a silicon (100) substrate compared with a carbon-implanted silicon layer as a function of carbon concentration. Both etchants were used at 85° C. The graph of the EDP etch indicates a significantly reduced etch rate for carbon-doped silicon. At a carbon peak concentration of $1.5 \times 10^{21}$ $cm^{-3}$, the etch selectivity of EDP is approximately 1000. In the carbon concentrations shown, a continuous SiC layer is not formed. Rather, the etch-stop effect of the carbon-doped silicon layer appears to arise from chemical characteristics of a non-stoichiometric $Si_xS_{1-x}$ alloy formed by randomly distributed implanted carbon atoms contained within the crystalline structure of host silicon atoms. SiC layers deposited by either chemical vapor deposition (CVD) or implantation of carbon show almost no etch rate in either EDP, KOH, or any other alkaline solution.

With reference to FIG. 4, a $Si_{0.7}Ge_{0.3}$ layer, grown by molecular beam epitaxy (MBE) at 500° C. produced an etch selectivity of 17 with respect to silicon (100) prior to an 850° C. anneal. The germanium concentration in the layer was $1.5 \times 10^{22}$ $cm^{-3}$. An implanted (or grown) initial carbon profile 401 expands tremendously to a post-anneal profile 403. After the anneal, the selectivity dropped to a range from 10 to 12. The etch-stop effect is believed to be associated with strain induced by the relatively larger germanium atom.

In addition to problems created by reduced selectivity, other problems arise with using carbon or germanium as an etch-stop. A skilled artisan recognizes that carbon diffuses readily in pure silicon and thus the etch-stop layer readily increases in thickness. Germanium also grows in thickness after subsequent anneal steps. Carbon and germanium etch-stop layers of the prior art are frequently hundreds of nanometers in width (at full-width half-maximum (FWHM)). Therefore, what is needed is an extremely thin and robust etch-stop layer having a high etchant selectivity in comparison with silicon.

SUMMARY

In an exemplary embodiment, the present invention is an etch-stop layer comprising a silicon-germanium layer having a ratio of silicon to germanium of about 50:1 or less and boron and carbon layers formed within the silicon-germanium layer. The boron and carbon layers each have a full-width half-maximum (FWHM) thickness value of less than 50 nanometers. The etch-stop layer has a ratio of boron to carbon in a range of about 0.5 to 1.5.

In another exemplary embodiment, the present invention is an etch-stop layer comprising a silicon-germanium layer. A boron layer and a carbon layer are each formed within the silicon-germanium layer. The boron layer and the carbonyl each have an FWHM thickness value of less than 50 nanometers.

In another exemplary embodiment, the present invention is a method to fabricate an etch-stop. The method comprises flowing a carrier gas over a substrate in a deposition chamber, flowing a silicon precursor gas over the substrate in the deposition chamber, and flowing a germanium precursor gas over the substrate. The silicon-germanium layer is formed such that a ratio of silicon to germanium is in a range from 4:1 to 50:1. A carbon precursor gas and a boron precursor gas are each flowed over the substrate in the deposition chamber. The carbon and boron precursor gases form a carbon layer and boron lawyer respectively, each layer being less than 50 nanometers in FWHM thickness and each acting as a portion of the etch-stop.

In another exemplary embodiment, the present invention is an etch-stop layer comprising a silicon-germanium layer having a ratio of silicon to germanium of in a range of 4:1 to 50:1. A boron layer and a carbon layer are each formed within the silicon-germanium layer. The boron layer and the carbon layer each have an FWHM thickness value of less than 20 nanometers. The etch-stop layer has a ratio of boron to carbon in a range of about 0.5 to 1.5.

DETAILED DESCRIPTION

Disclosed herein are a fabrication method and a structure resulting therefrom for a carbon-doped nanoscale etch-stop. The carbon is doped into a strained boron-doped SiGe semiconductor substrate or film, thus producing an etch-stop with an FWHM thickness of less than 50 nm. In various embodiments presented herein, the FWHM thickness is less than approximately 20 nm. Secondary-ion mass spectrometry (SIMS) data are displayed, in graphs below, for B, C, and Ge diffusion in $Si_{1-x-y-z}Ge_xC_yB_z$ strained layers along with specific embodiments of elemental ratios to produce the etch-stop of the present invention. The carbon nanoscale etch-stop described herein has particular applications in BESOI processing. However, the disclosed carbon etch-stop is not limited only to BESOI applications.

A BESOI substrate fabricated in accordance with one exemplary embodiment of the present invention has particular applications in low-power and radiation-hardened CMOS devices. Incorporation of the present invention in various electronic devices simplifies certain fabrication processes, improves scalability of devices, improves sub-threshold slopes, and reduces parasitic capacitances.

Figure 1A:
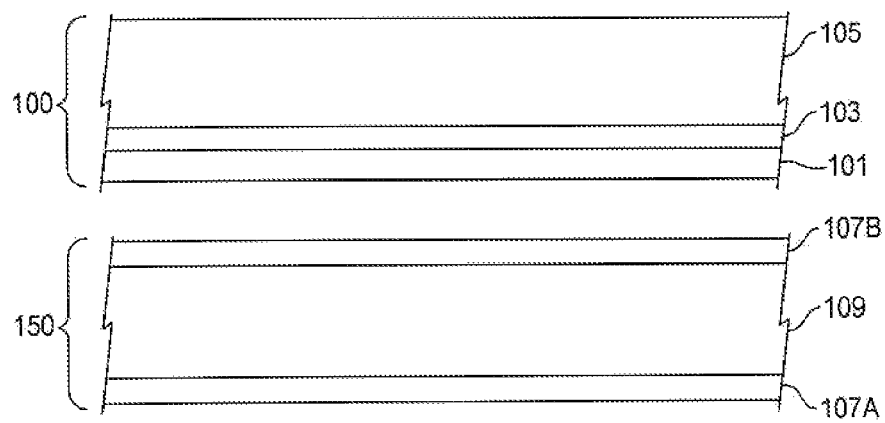
FIGS. 1A-1D are cross-sectional views of a prior art bond and etch back silicon on insulator (BESOI) fabrication technique.
Figure 1B:
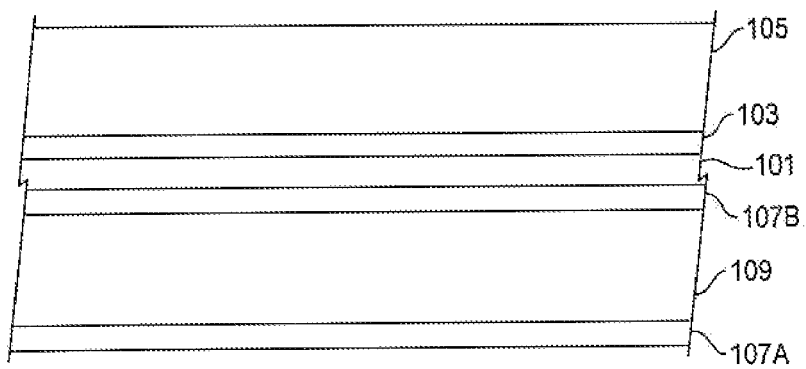
Figure 1C:
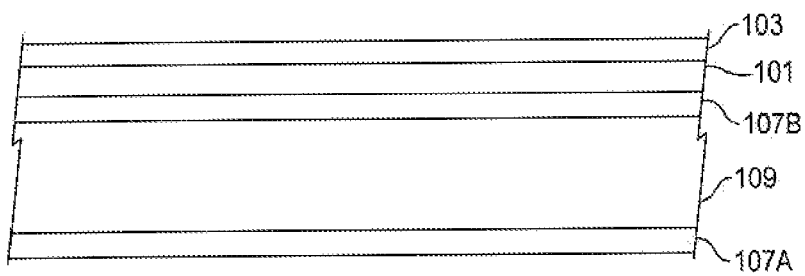
Figure 1D:
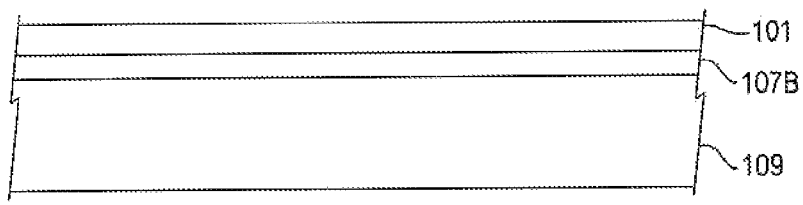
Figure 2A:
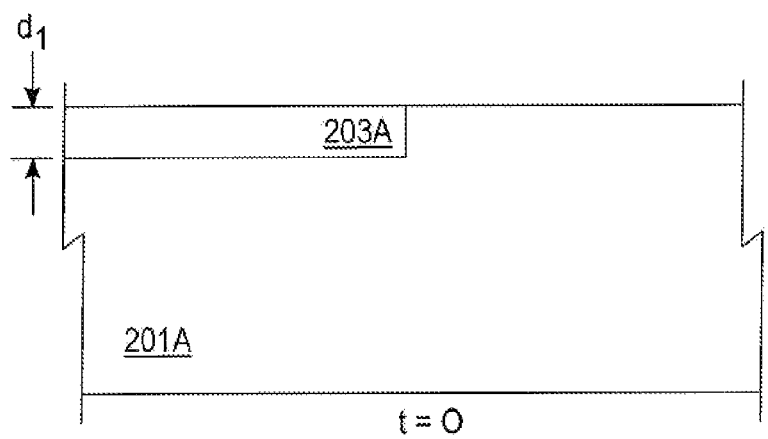
FIGS. 2A-2C are cross-sectional views of an etch-stop formed on a silicon substrate, indicating a method to determine etch-stop efficiency.
Figure 2B:
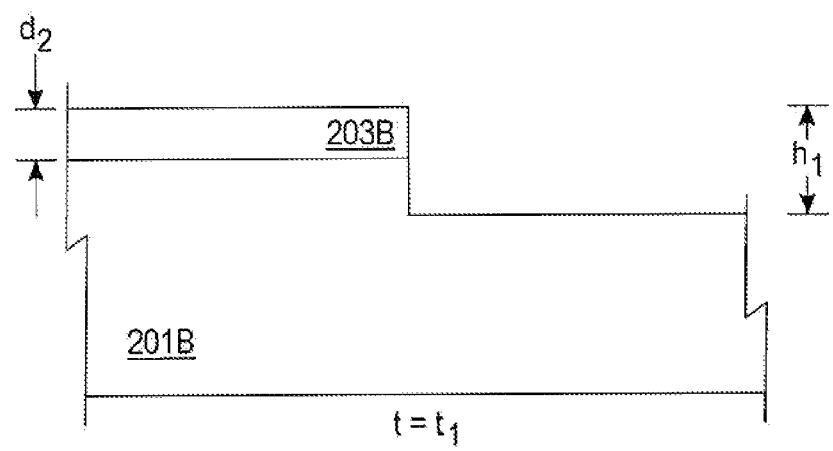
Figure 2C:
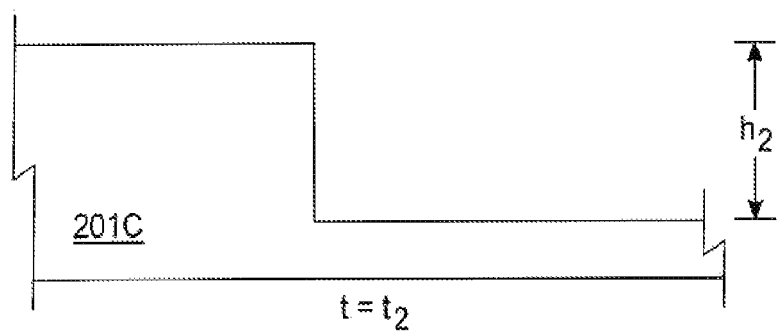
Figure 3:
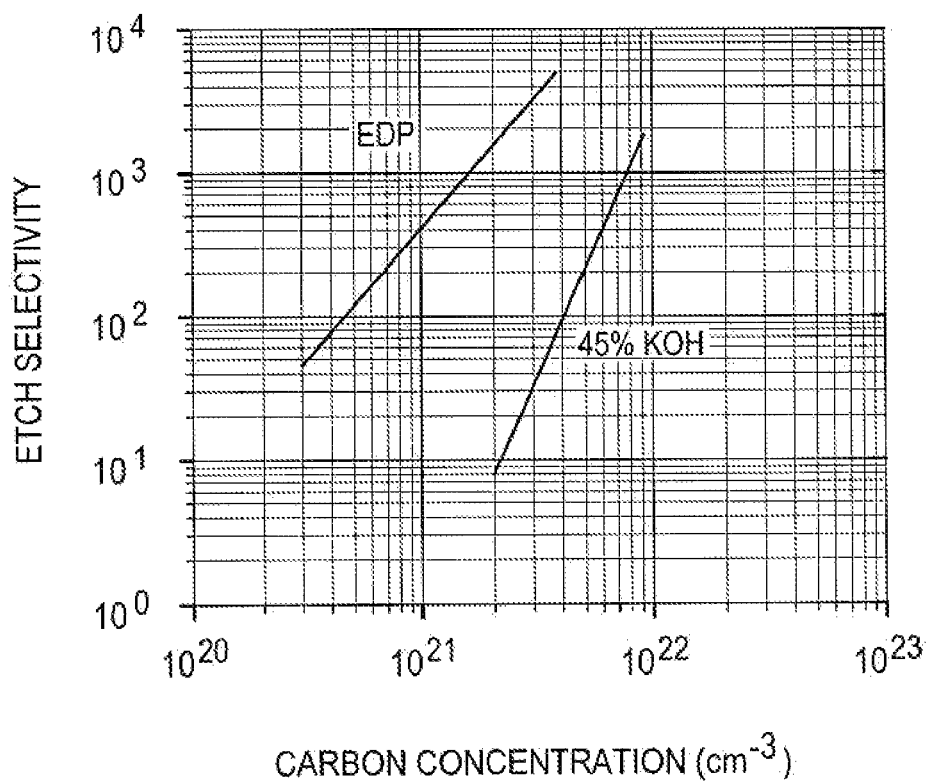
FIG. 3 is a graph indicating etch selectivity for ethylenediamine-pyrocatechol (EDP) and 45% potassium hydroxide (KOH) wet-chemical enchants for a silicon (100) substrate compared with a carbon-implanted silicon layer as a function of carbon concentration.
Figure 4:
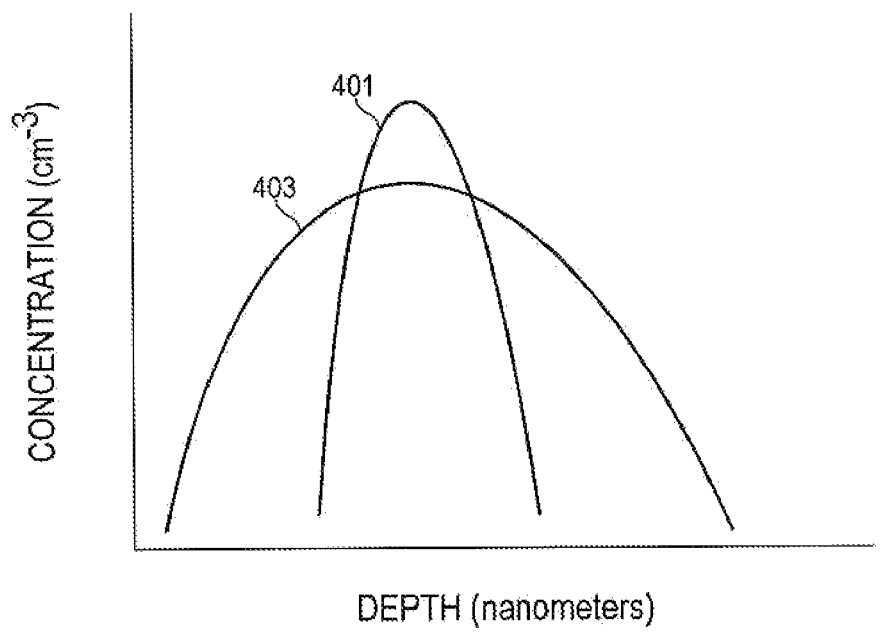
FIG. 4 is a graph indicating a profile of carbon concentration as implanted or grown with a profile of the carbon after annealing.
Figure 5:
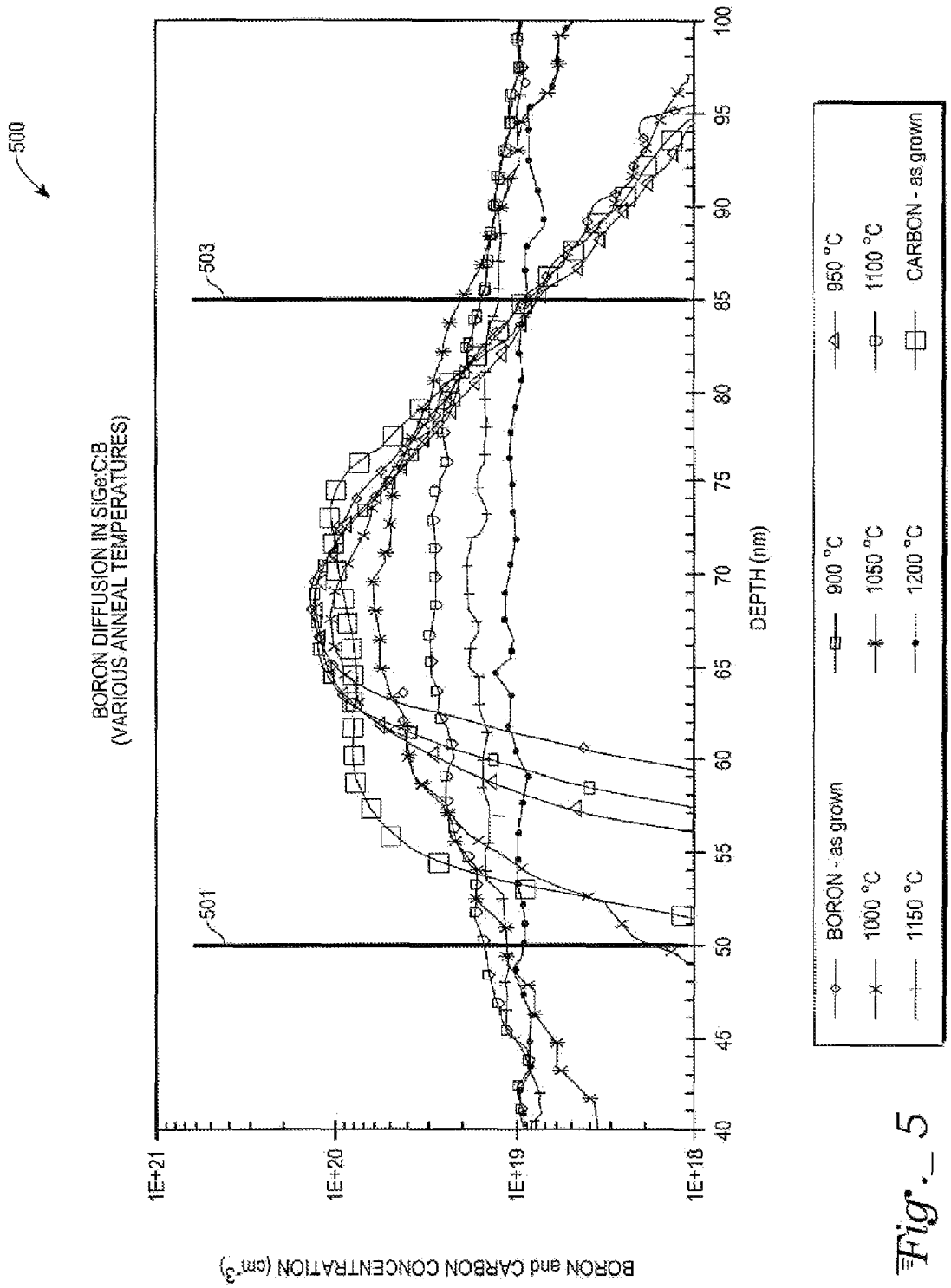
FIG. 5 is a graph indicating a full-width half-maximum (FWHM) depth of a boron profile produced in accordance with the present invention and measured after thermal annealing steps.

With reference to FIG. 5, a SIMS profile graph 500 representing data from a diffusion profile of boron in carbon and Ge-doped silicon (SiGe:C:B). A location of the Ge dopant is illustrated by a lower 501 and an upper 503 vertical line positioned at 50 nm and 85 nm depths, respectively. The boron remains relatively fixed up to temperatures of 1000° C., then diffuses rapidly at higher temperatures (anneal times are 10 seconds at each temperature). However, the presence of both carbon and Ge, as introduced under embodiments of the present invention, reduces boron outdiffusion. Depending on concentrations and temperatures involved, the presence of carbon and Ge reduces overall boron diffusion by a factor of ten or more. In a specific exemplary embodiment, the particular alloy of SiGe:C:B is $Si_{0.975}Ge_{0.02}C_{0.002}B_{0.003}$. Thus, a ratio of Si to Ge is approximately 50:1 and a ratio of B to C is approximately 1.5:1.

Figure 6:
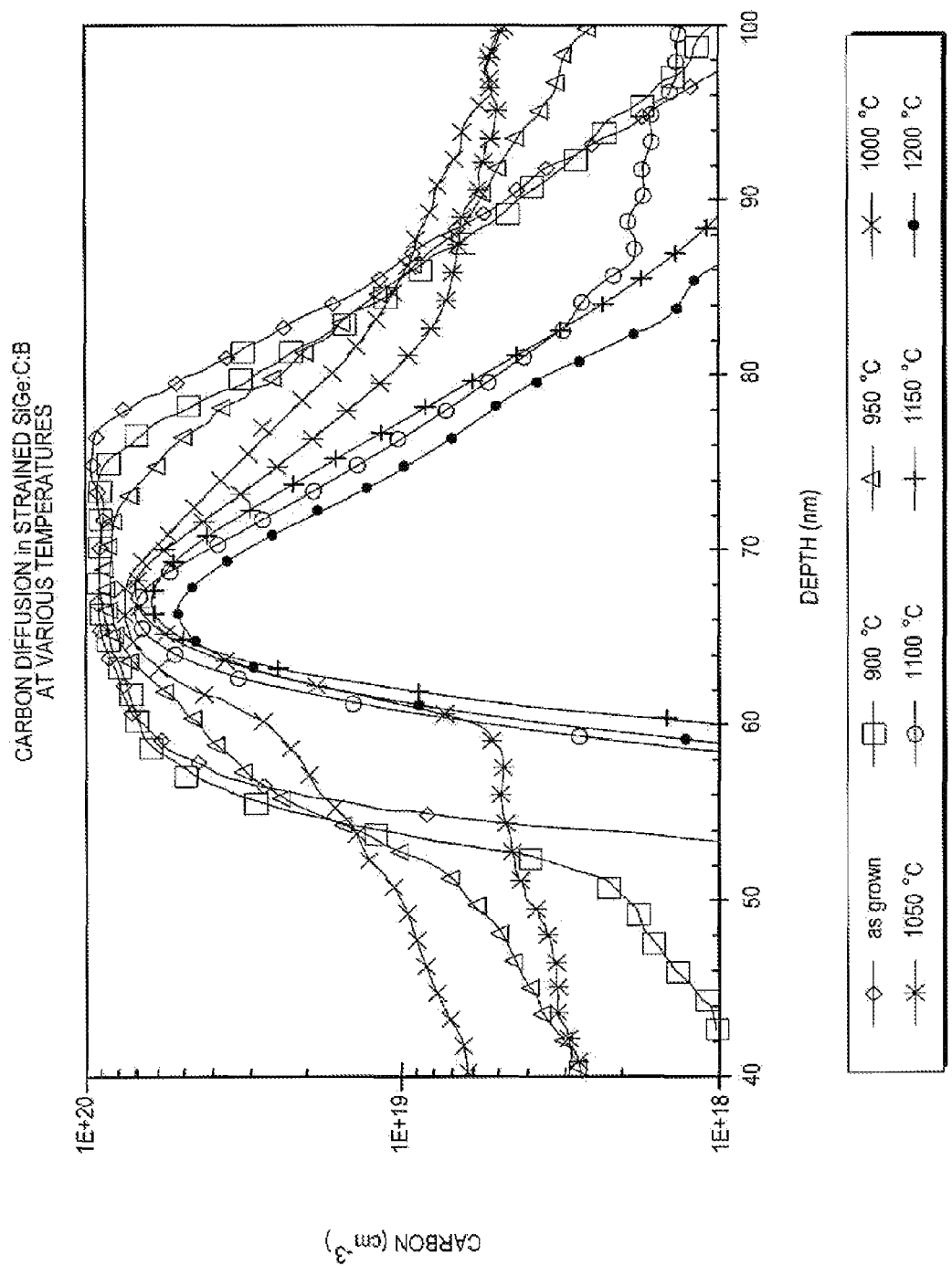
FIG. 6 is a graph indicating carbon diffusion depth in strained SiGe:C:B at various anneal temperatures.

FIG. 6 indicates, in another embodiments a significantly lower ratio Si to Ge SIMS profile. Carbon diffusion levels in strained SiGe:C:B are indicated as grown and at subsequent anneal temperatures of 900° C. to 1200° C. The data show carbon diffusion primarily from undoped spacer regions (not shown) in which the spacer regions have no B doping. However, a center region of the SIMS profile (i.e., at a depth of roughly 60 nm to 80 nm) indicates that carbon diffusion is significantly mitigated due to the presence of B in the SiGe film. In this exemplary embodiment, the SiGe:C:B film is 79.5% Si, 20% Ge, 0.2% C, and 0.3% boron, prior to thermal anneal ($Si_{0.795}Ge_{0.2}C_{0.002}B_{0.003}$) Thus a ratio of Si to Ge is approximately 4.1 and a ratio of B to C is approximately 1.5:1.

Figure 7:
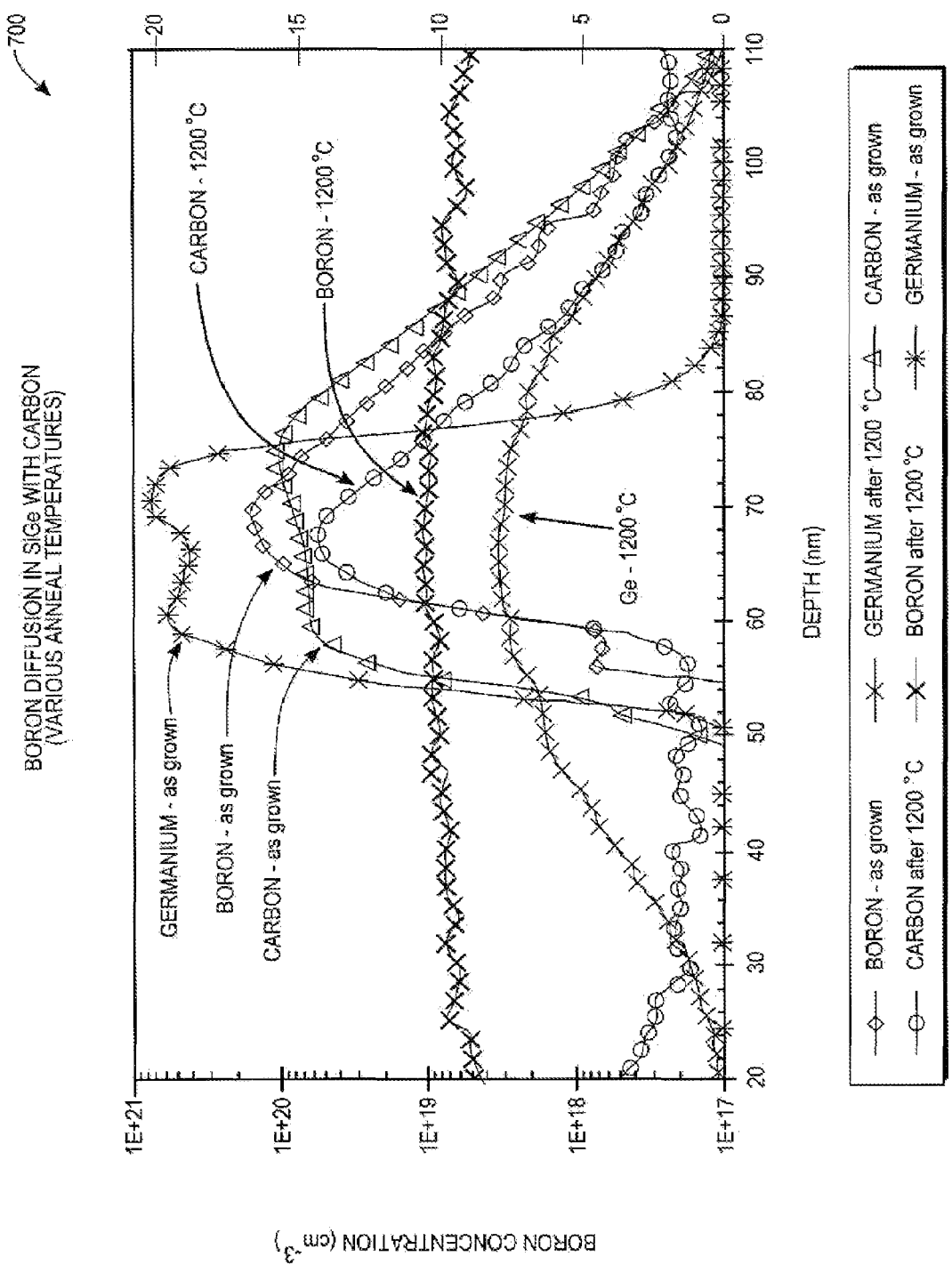
FIG. 7 is a graph indicating boron diffusion depth in SiGe with carbon at various anneal temperatures.

FIG. 7 is a SIMS profile 700 indicating boron diffusion depth in SiGe with carbon at various anneal temperatures. The SiGe film employed in this embodiment is also $Si_{0.795}Ge_{0.2}C_{0.002}B_{0.003}$, similar to the film used in producing the graph of FIG. 6. Note the SIMS profile 700 indicates that, following a 1200° C. anneal for 10 seconds, germanium has diffused from a peak of 20% (i.e., approximately $1.0 \times 10^{22}$ atoms/$cm^3$) to a peak concentration of 7.7% (i.e., approximately $3.85 \times 10^{21}$ atoms/$cm^3$). Boron has diffused from a peak of $1.5 \times 10^{20}$ atoms/$cm^3$ to a peak of $1.0 \times 10$ atoms/$cm^3$.

Additionally, carbon has diffused but the diffusion mechanism involved is due primarily to the SiGe spacers (the outside edges that contained only Ge and C during the initial growth). The carbon peak has diffused from $1.0 \times 10^{20}$ atoms/$cm^3$ down to $7.0 \times 10^9$ atoms/$cm^3$ (indicating roughly a 30% peak reduction). The final diffused profile of the carbon is narrower than the as-grown profile. As a result, the final diffused carbon profile, even after a 1200° C. anneal is less than 20 nm wide at FWHM.

One skilled in the art will recognize from FIGS. 5-7 that the carbon remains in the central boron-doped region. Further the carbon is thermally stable up to very high temperatures (e.g., greater than about 1200° C.).

Fabrication Process for the Carbon Etch-stop Layer

Overall, process conditions can vary widely depending upon particular devices fabricated, specific equipment types employed, and various combinations of starting materials. However, in a specific exemplary embodiment, the process conditions generally entail flowing hydrogen ($H_2$) as a carrier gas in a chemical vapor deposition (CVD) system at a flow rate between 10 standard liters per minute (slpm) and 50 slpm. Alternatively, inert gases such as nitrogen ($N_2$), argon (Ar), helium (He), xenon (Xe), and fluorine ($F_2$) are all suitable carrier gases as well.

Silane ($SiH_4$) may be used as a silicon precursor gas, flowing between 10 standard cubic centimeters per minute (sccm) and 100 sccm. Alternatively, disilane ($Si_2H_6$) or another silicon precursor gas, may be used in place of silane. Disilane deposits silicon at a faster rate and lower temperature than silane.

Methyl silane ($CH_3SiH_3$), or another carbon precursor gas, flowing at between 50 sccm end 500 sscm may be employed as the carbon precursor. Diborane ($B_2H_6$) may be used as a boron precursor gas, flowing at between 50 sccm and 300 sccm. Additionally, boron trichloride ($BCl_3$) or any other boron precursor gas may be used in place of diborane. Boron and carbon precursor gases are flowed such that a ratio of boron to carbon is in a range of approximately 0.5 to 1.5, although ratios outside of this range may be useable as well with suitable characterization.

Germanium tetrahydride ($GeH_4$) or another germanium precursor gas flowing at between 5 sccm and 1000 sccm may be employed as the germanium precursor gas.

All gas flow rates may be process, equipment, and/or device dependent. Therefore, gas flow rates outside of the exemplary ranges given may be fully acceptable. For example, if a low-pressure CVD (LPCVD) reactor is employed, growth temperatures may be in a range of about 550° C. to 700° C. for SiGe and about 550° C. to 950° C. for silicon. Further, gas flows for formation of the SiGe layer are typically running simultaneously during processing.

Carbon may also be incorporated in a remote carbon injection method. In the remote injection method, carbon is only present in spacers (not shown) formed over regions where carbon is to be formed. Formation of spacers are known to a skilled artisan. In a specific exemplary embodiment, the spacers are comprised of SiGe. A remote carbon technique, suitable for adding carbon in various embodiments described herein, is disclosed in U.S. patent application Ser. No. 11/166,287 filed Jun. 23, 2005, entitled "Method for Growth and Optimization of Heterojunction Bipolar Film Stacks by Remote injection," and commonly assigned, along with this application, to Atmel Corporation, San Jose, Calif. The Ser. No. 11/166,287 application is hereby incorporated by reference in its entirety.

Briefly, the remote carbon injection technique entails a carbon implantation or diffusion step in a semiconductor fabrication process to inject carbon atoms into, for example, a semiconductor device layer and surrounding regions. The carbon is derived from a carbon precursor such as methyl silane. Carbon precursor injection can be accomplished by techniques such as LPCVD (low pressure chemical vapor deposition), UHCVD (ultra-high vacuum CVD), MBE (molecular beam epitaxy), or ion implantation. If a remote carbon injection technique is employed, methyl silane only needs to be flowed during spacer formation.

The carbon injection may be followed by a thermal anneal step. The thermal anneal step allows the carbon to diffuse into, for example, a base region of a transistor. Note that, even though a carbon precursor may be injected outside of the base region, the position of the carbon after anneal is within the base region due to an energetically favorable diffusion mechanism. Therefore, remote injection is a means of doping a semiconductor with carbon and provides numerous advantages over conventional fabrication methods, discussed above (e.g., preventing boron outdiffusion thus allowing a higher boron-dopant concentration). Therefore, a location of injection and not necessarily a final resting place of carbon following thermal cycles determines a definition of remote carbon injection.

If self-aligning techniques incorporating dielectric spacers are employed, for example, in transistor fabrication, the remote injection can occur during or after growth of a base-emitter spacer (BE) or a base-collector spacer (BC). (Note: formation of neither the BE nor BC spacer are shown but such techniques are well-known in the art). Carbon injection may be performed at multiple points during fabrication of either the base, BC, BE, collector, and/or emitter regions. Thermal anneal cycles are then implemented to provide activation energy for the carbon to diffuse from the dielectric spacer into the one or more various semiconductor regions. A final position of carbon after anneal is within the semiconductor through a diffusion mechanism. Advantages of remote carbon injection thus include a reduced boron outdiffusion and a significant reduction in the transistor base resistance.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, although process steps and techniques are shown and described in detail, a skilled artisan will recognize that other techniques and methods may be utilized which are still included within a scope of the appended claims. For example, there are frequently several techniques used for depositing a film layer (e.g., chemical vapor deposition, plasma-enhanced vapor deposition, epitaxy, atomic layer deposition, etc.). Although not all techniques are amenable to all film types described herein, one skilled in the art will recognize that multiple methods for depositing a given layer and/or film type may be used.

Additionally, many industries allied with the semiconductor industry could make use of the carbon etch-stop disclosed herein. For example, a thin-film head (TFH) process in the data storage industry or an active matrix liquid crystal display (AMLCD) in the flat panel display industry could readily make use of the processes and techniques described herein. The term "semiconductor" should be recognized as including the aforementioned and related industries. The specification and drawings are, accordingly, to be regarded in an illustrative rather than a restrictive sense.

What is claimed is:

1. An integrated circuit structure comprising:
a silicon-germanium etch-stop layer located on a surface of the integrated circuit structure and having a ratio of silicon to germanium of about 50:1 or less, the silicon germanium etch-stop layer doped with boron in a boron layer and carbon in a carbon layer, each layer having a full-width half-maximum (FWHM) thickness value of less than 50 nanometers, wherein the carbon reduces boron diffusion and the boron reduces carbon diffusion, the etch-stop layer having a ratio of boron to carbon ranging from 0.5:1.5 to 1.5:1.

2. The integrated circuit structure of claim 1 wherein the silicon-germanium layer is contained within a silicon-germanium film layer.

3. The integrated circuit structure of claim 1 wherein the ratio of silicon to germanium is within a range of 50:1 to 4:1.

4. The integrated circuit structure of claim 1 wherein the boron layer is less than about 20 nanometers in thickness when measured as an FWHM value.

5. The integrated circuit structure of claim 1 wherein the carbon layer is less than about 20 nanometers in thickness when measured as an FWHM value.

6. An etch-stop layer comprising a silicon-germanium layer doped with boron in a boron layer and carbon in a carbon layer, each of the boron and carbon layers having a full-width half-maximum (FWHM) thickness value of less than 20 nanometers.

7. The etch-stop layer of claim 6 wherein a ratio of silicon to germanium in the silicon-germanium layer is 50:1 or less.

8. The etch-stop layer of claim 6 wherein a ratio of silicon to germanium in the silicon-germanium layer is greater than 4:1.

9. The etch-stop layer of claim 6 wherein a ratio of silicon to germanium in the silicon-germanium layer ranges from about 4:1 to 50:1.

10. A method comprising:
flowing a carrier gas over an integrated circuit structure in a deposition chamber;
flowing silicon and germanium precursor gases over the integrated circuit structure in a deposition chamber in a ratio of silicon to germanium ranging from 4:1 to 50:1 to form a strained silicon-germanium etch-stop layer; and
flowing carbon and boron precursor gases over the integrated circuit structure in the deposition chamber to form carbon and boron layers in the strained-silicon-germanium layer, each of the carbon and boron layers having a full-width half-maximum (FWHM) value of less than 50 nanometers, wherein carbon in the carbon layer reduces boron diffusion and boron in the boron layer reduces carbon diffusion,
wherein the boron and carbon precursor gases are flowed in a ratio ranging from about 0.5:1.5 to 1.5:1.

11. The method of claim 10 wherein the boron layer is less than about 20 nanometers in thickness when measured as an FWHM value.

12. The method of claim 10 wherein the carbon layer is less than about 20 nanometers in thickness when measured as an FWHM value.

13. An etch-stop layer comprising:
a silicon-germanium layer having a ratio of silicon to germanium of in a range of 4:1 to 50:1;
a boron layer formed within the silicon-germanium layer, the boron layer having a full-width half-maximum (FWHM) thickness value of less than 20 nanometers; and
a carbon layer formed within the silicon-germanium layer, the carbon layer having an FWHM thickness value of less than 20 nanometers, the etch-stop layer having a ratio of boron to carbon in a range of about 0.5 to 1.5.

14. The etch-stop layer of claim 13 wherein carbon in the carbon layer reduces boron diffusion and boron in the boron layer reduces carbon diffusion.

15. The integrated circuit structure of claim 13 wherein the germanium reduces boron diffusion.

16. A method comprising:
flowing a carrier gas over an integrated circuit structure in a deposition chamber;
flowing silicon and germanium precursor gases over the integrated circuit structure in the deposition chamber in a ratio of silicon to germanium ranging from 4:1 to 50:1 to form a strained silicon-germanium etch-stop layer; and
flowing carbon and boron precursor gases over the integrated circuit structure in the deposition chamber to form carbon and boron layers in the strained silicon-germanium layer, each of the carbon and boron layers having a full-width half-maximum (FWHM) thickness value of less than 20 nanometers, wherein carbon in the carbon layer reduces boron diffusion and boron in the boron layer reduces carbon diffusion.

17. An electronic device comprising:
an integrated circuit structure having an etch-stop layer comprising:
a silicon-germanium layer located on the integrated circuit structure and having a ratio of silicon to germanium in a range of 4:1 to 50:1; and
boron and carbon layers located in the silicon-germanium layer, each of the boron and carbon layers having a full-width half-maximum (FWHM) thickness value of less than 50 nanometers, wherein carbon in the carbon layer reduces boron diffusion and boron in the boron layer reduces carbon diffusion, the etch-stop layer having a ratio of boron to carbon ranging from 0.5:1.5 to 1.5:1.

18. The electronic device of claim 17 comprising a bond-and-etch-back silicon-on-insulator (BESOI) substrate.

19. The electronic device of claim 17 wherein boron diffusion is reduced by a factor of ten or more.

20. The integrated circuit structure of claim 17 wherein the germanium reduces boron diffusion.

21. A system comprising:
an integrated circuit structure having an etch-stop layer comprising:
a silicon-germanium layer located on the integrated circuit structure and having a ratio of silicon to germanium in a range of 4:1 to 50:1; and
boron and carbon layers located in the silicon-germanium layer, each layer having a full-width half-maximum (FWHM) thickness value of less than 50 nanometers, wherein carbon in the carbon layer reduces boron diffusion and boron in the boron layer reduces carbon diffusion, the etch-stop layer having a ratio of boron to carbon ranging from 0.5:1.5 to 1.5:1; and
a liquid crystal display or data storage coupled to the integrated circuit structure.

22. The system of claim 21 wherein the boron layer is less than about 20 nanometers in thickness when measured as an FWHM value.

23. The system of claim 21 wherein the carbon layer is less than about 20 nanometers in thickness when measured as an FWHM value.

24. The system of claim 21 wherein the integrated circuit structure is a silicon-based semiconductor structure.

* * * * *

UNITED STATES PATENT AND TRADEMARK OFFICE
CERTIFICATE OF CORRECTION

| | |
|---|---|
| PATENT NO. | : 7,495,250 B2 |
| APPLICATION NO. | : 11/553333 |
| DATED | : February 24, 2009 |
| INVENTOR(S) | : Enicks |

It is certified that error appears in the above-identified patent and that said Letters Patent is hereby corrected as shown below:

On the Title Pg, Item 56, under "Other Publications", line 3, delete "Aug. 26, 2006]." and insert -- Aug. 24, 2006]. --, therefor.

On the Title Pg, on Page 2, Item 56, under "Other Publications", line 23, delete "131(1)," and insert -- 13(1), --, therefor.

On the Title Pg, on Page 2, Item 56, under "Other Publications", line 47, delete "12/144,571" and insert -- 12/114,571 --, therefor.

In column 1, line 10, after "particularly" insert -- , --.

In column 1, line 13, after "subjected" delete ",".

In column 1, line 21, after "germanium" delete ",".

In column 1, line 23, after "These" delete ",".

In column 1, line 44, delete "arid" and insert -- and --, therefor.

In column 1, line 57, delete "foxed" and insert -- formed --, therefor.

In column 1, line 59, delete "water" and insert -- wafer --, therefor.

In column 2, line 7, delete "enchant." and insert -- etchant. --, therefor.

In column 2, line 9, delete "water" and insert -- wafer --, therefor.

In column 2, line 24, delete "icon" and insert -- silicon --, therefor.

In column 2, line 59, delete "flow" and insert -- now --, therefor.

In column 3, line 6, after "be" delete ",".

In column 3, line 45, delete "$Si_xS_{1-x}$" and insert -- $Si_xC_{1-x}$ --, therefor.

In column 4, line 31, delete "lawyer" and insert -- layer --, therefor.

In column 4, line 54, delete "enchants" and insert -- etchants --, therefor.

UNITED STATES PATENT AND TRADEMARK OFFICE
CERTIFICATE OF CORRECTION

PATENT NO. : 7,495,250 B2
APPLICATION NO. : 11/553333
DATED : February 24, 2009
INVENTOR(S) : Enicks It is certified that error appears in the above-identified patent and that said Letters Patent is hereby corrected as shown below:

In column 5, line 40, delete "embodiments" and insert -- embodiment, --, therefor.

In column 5, line 51, before "Thus" insert -- . --.

In column 5, line 52, delete "4.1" and insert -- 4:1 --, therefor.

In column 5, line 63, delete "1.0x10" and insert -- $1.0 \times 10^{19}$ --, therefor.

In column 6, line 1, delete "$7.0 \times 10^{9}$" and insert -- $7.0 \times 10^{19}$ --, therefor.

In column 6, line 7, after "Further" insert -- , --.

In column 6, line 29, delete "end" and insert -- and --, therefor.

In column 6, line 29, delete "sscm" and insert -- sccm --, therefor.

Signed and Sealed this

Fifth Day of May, 2009

JOHN DOLL
*Acting Director of the United States Patent and Trademark Office*